US010367041B2

(12) United States Patent
Xiong et al.

(10) Patent No.: US 10,367,041 B2
(45) Date of Patent: Jul. 30, 2019

(54) ORGANIC LIGHT-EMITTING DISPLAY PANEL AND ORGANIC LIGHT-EMITTING DISPLAY DEVICE INCLUDING TOUCH ELECTRODES

(71) Applicants: Shanghai Tianma AM-OLED Co., Ltd., Shanghai (CN); Tianma Micro-Electronics Co., Ltd., Shenzhen (CN)

(72) Inventors: Zhiyong Xiong, Shanghai (CN); Jianjie Zhu, Shanghai (CN); Liyuan Liu, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 112 days.

(21) Appl. No.: 15/596,147

(22) Filed: May 16, 2017

(65) Prior Publication Data

US 2017/0250230 A1    Aug. 31, 2017

(30) Foreign Application Priority Data

Oct. 31, 2016    (CN) .......................... 2016 1 0991666

(51) Int. Cl.
*G06F 3/045* (2006.01)
*H01L 27/32* (2006.01)
*G06F 3/044* (2006.01)
*G06F 3/041* (2006.01)

(52) U.S. Cl.
CPC ............ *H01L 27/323* (2013.01); *G06F 3/044* (2013.01); *G06F 3/0412* (2013.01)

(58) Field of Classification Search
CPC ....... H01L 27/323; G06F 3/0412; G06F 3/044
USPC ......................................................... 345/174
See application file for complete search history.

(56) References Cited

U.S. PATENT DOCUMENTS

| 2013/0181942 A1* | 7/2013 | Bulea ...................... G06F 3/044 345/174 |
| 2013/0293499 A1* | 11/2013 | Chang ..................... G06F 3/041 345/173 |
| 2014/0210767 A1* | 7/2014 | Hur ........................ G06F 3/0412 345/174 |
| 2015/0370369 A1* | 12/2015 | Kuo ........................ G06F 3/044 345/174 |

(Continued)

FOREIGN PATENT DOCUMENTS

| CN | 103984442 A | 8/2014 |
| CN | 104391604 A | 3/2015 |

(Continued)

*Primary Examiner* — Jonathan M Blancha
(74) *Attorney, Agent, or Firm* — Anova Law Group, PLLC

(57) ABSTRACT

An organic light-emitting display panel and an organic light-emitting display device are provided. The organic light-emitting display panel comprises an array substrate; a transparent cover plate; and an organic light-emitting layer configured between the array substrate and the transparent cover plate. The organic light-emitting layer comprises: a first electrode layer including a plurality of first electrodes, a plurality of first touch electrodes extending in a first direction, arranged in a second direction, and disposed in a same layer as the first electrode layer, and a plurality of second touch electrodes.

20 Claims, 11 Drawing Sheets

(56) References Cited

U.S. PATENT DOCUMENTS

2017/0010730 A1* 1/2017 Chuang ................ G06F 3/0414
2017/0010734 A1* 1/2017 Liu ........................ G06F 3/044

FOREIGN PATENT DOCUMENTS

| CN | 104409467 A | 3/2015 |
| CN | 104752466 A | 7/2015 |
| CN | 104795425 A | 7/2015 |

* cited by examiner

ORGANIC LIGHT-EMITTING DISPLAY PANEL AND ORGANIC LIGHT-EMITTING DISPLAY DEVICE INCLUDING TOUCH ELECTRODES

CROSS-REFERENCES TO RELATED APPLICATIONS

This application claims priority of Chinese Patent Application No. 201610991666.7, filed on Oct. 31, 2016, the entire contents of which are hereby incorporated by reference.

FIELD OF THE DISCLOSURE

The present disclosure generally relates to the field of display technology and, further relates to touch display technologies and, more particularly, relates to an organic light-emitting display panel and an organic light-emitting display device including the organic light-emitting display panel.

BACKGROUND

As the display technology advances and the requirement of the interactive operation of the human-computer interface increases, display screens are highly desired to display different image content according to the touch operation performed on the display screen. To meet such a demand, a touch control unit is added to the cover glass of an organic light-emitting display panel, to realize a touch control organic light-emitting display panel. However, the formed organic light-emitting display panel often substantially thick and bulky.

To reduce the thickness of the touch control organic light-emitting display panel, the touch unit is disposed in the internal, structure of the organic light-emitting display panel, i.e., inside the organic light-emitting display panel. However, the touch driving electrodes and the touch detecting electrodes of the touch unit form coupling capacitors with cathodes. The coupling capacitors may affect the touch performance of the display panel and, accordingly, reduce the precision of touch detection.

The disclosed organic light-emitting display panel and organic light-emitting display device are directed to solve one or more problems set forth above and other problems.

BRIEF SUMMARY OF THE DISCLOSURE

One aspect of the present disclosure provides an organic light-emitting display panel. The organic light-emitting display panel comprises an array substrate; a transparent cover plate; and an organic light-emitting layer configured between the array substrate and the transparent cover plate, wherein the organic light-emitting layer comprises: a first electrode layer including a plurality of first electrodes, a plurality of first touch electrodes extending in a first direction, arranged in a second direction, and disposed in a same layer as the first electrode layer, and a plurality of second touch electrodes.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined under conditions without conflicts.

Figure 1:
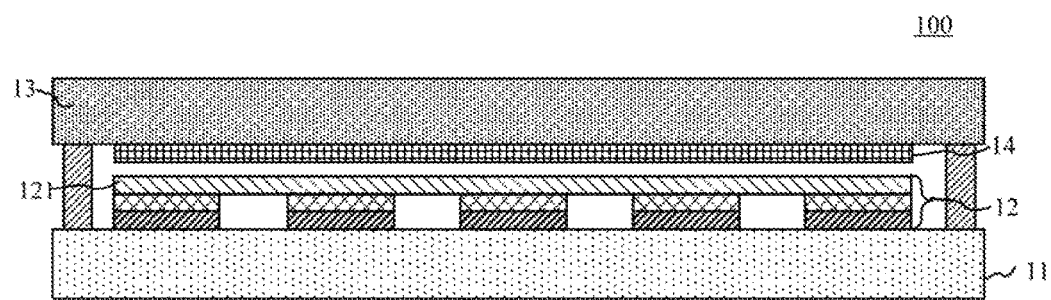
FIG. 1 illustrates a schematic diagram of an existing touch organic light-emitting display panel.

FIG. 1 illustrates a schematic diagram of an existing touch organic light-emitting display panel. The existing organic light-emitting display panel 100 may include an array substrate 11, an organic light-emitting layer 12, and a cover plate 13. A touch unit 14 may be formed at a lower surface of the cover plate 13, which may reduce the thickness of the touch organic light-emitting display panel 100. However, the touch driving electrodes and the touch detecting electrodes of the touch unit may form coupling capacitors with cathodes, which may reduce the precision of touch detection.

Figure 2:
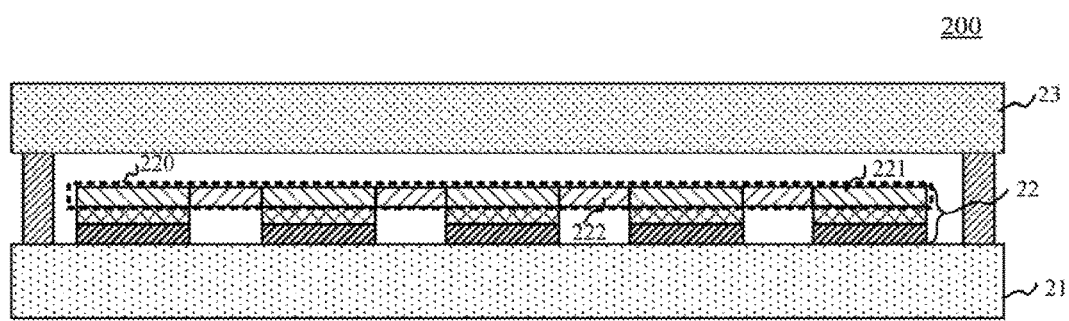
FIG. 2 illustrates a schematic diagram of an exemplary organic light-emitting display panel consistent with disclosed embodiments.
Figure 3:
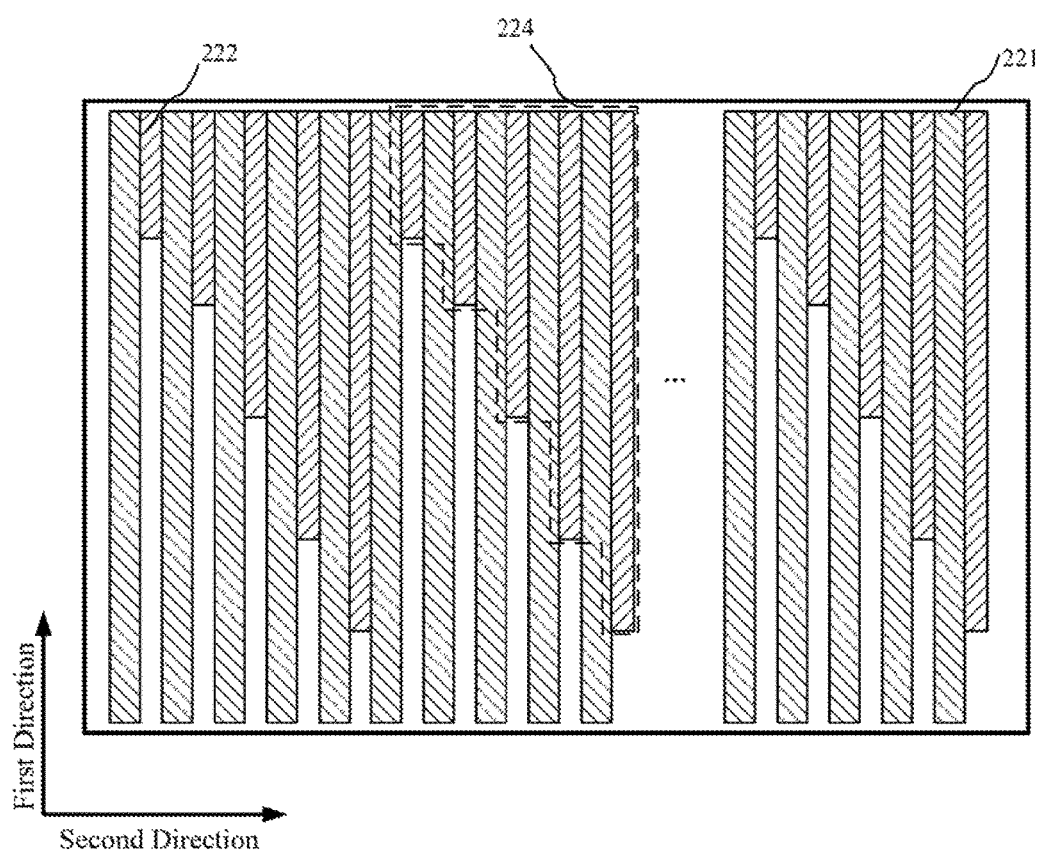
FIG. 3 illustrates an exemplary relative positional relationship between a first electrode, and a first touch electrode of an exemplary organic light-emitting display panel in FIG. 2 consistent with disclosed embodiments.

The present disclosure provides an improved organic light-emitting display panel, FIG. 2 illustrates a schematic diagram of an exemplary organic light-emitting display panel consistent with disclosed embodiments; and FIG. 3 illustrates an exemplary relative positional relationship between a first electrode, and a first touch electrode of an exemplary organic light-emitting display panel in FIG. 2 consistent with disclosed embodiments.

As shown in FIG. 2, the organic light-emitting display panel 200 may include an array substrate 21, an organic light-emitting layer 22 and a transparent cover plate 23. The organic light-emitting layer 22 may be disposed between the array substrate 21 and the transparent cover plate 23.

The organic light-emitting layer 22 may include a first electrode layer 220. The first electrode layer 220 may include a plurality of stripe-shaped first electrodes 221. As shown in FIG. 3, the stripe-shaped first electrodes 221 may extend in a first direction, and the plurality of first electrodes 221 may be arranged in a second direction. In one embodiment, the first direction may be perpendicular to the second direction. The second direction may be, for example, a horizontal direction in FIG. 3, and the first direction may be a vertical direction in FIG. 3. In another embodiment, the first direction and the second direction may be non-perpendicular. The first direction and the second direction in FIG. 3 is for illustrative purposes and is not intend to limit the scope of the present disclosure.

To enable the touch control function in the organic light-emitting display panel 200, first touch electrodes and second touch electrodes for implementing the touch-function may be configured between the array substrate 21 and the transparent cover plate 23. For example, the first touch electrodes and the second touch electrodes may be disposed in the organic light-emitting layer 22. For example, the first touch electrode may be a stripe-shaped electrode, and the second touch electrode may be a stripe-shaped electrode. When the first touch electrodes and the second touch electrodes are disposed in the organic light-emitting layer 22, the first touch electrodes may be disposed in the first electrode layer 220.

As shown in FIG. 3, in the first electrode layer 220, a plurality of first touch electrodes 222 may extend in the first direction, and the plurality of first touch electrodes 222 may be arranged in the second direction. That is, the first touch electrodes 232 and the first electrodes 221 may be configured in the same layer, and the first touch electrode 222 and the first electrode 221 may be disposed in parallel, but insulated from each other.

In certain embodiments, the first electrode layer 220 may be a cathode layer of the organic light-emitting layer 22.

In certain embodiments, at least one first electrode 221 may be disposed between two adjacent first touch electrodes 222. That is, in the first electrode layer 220, the first electrodes 221 and the first touch electrodes 222 may be arranged alternately in the second direction.

In certain embodiments, the first touch electrode may be a touch detecting electrode, and the second touch electrode may be a touch driving electrode. In certain other embodiments, the first touch electrode may be a touch driving electrode, and the second touch electrode may be a touch detecting electrode.

In the disclosed organic light-emitting display panel, by configuring the cathode layer as a plurality of stripe-shaped cathodes and alternately arranging the first touch electrodes and the stripe-shaped cathodes, the coupling capacitance between the first touch electrodes and the cathode layer may be substantially reduced. Accordingly, the influence of the cathodes on the touch performance during the touch stage may be reduced, and the precision of the touch detection may be improved.

Figure 4:
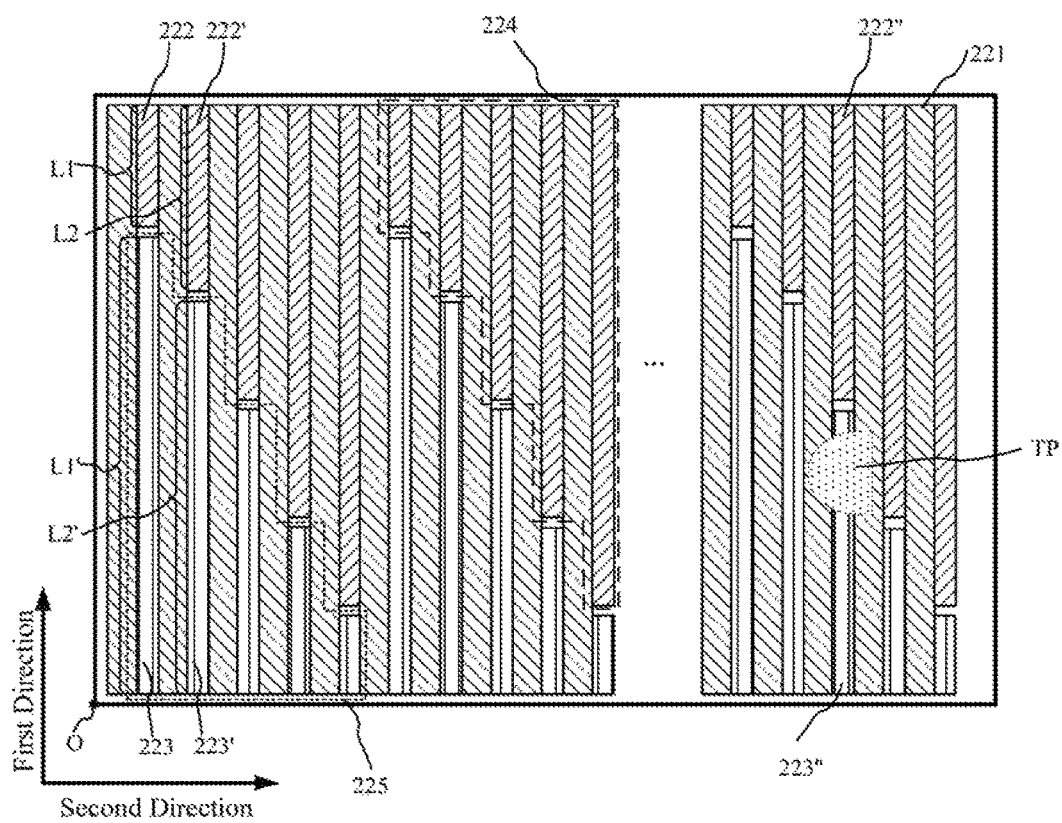
FIG. 4 illustrates an exemplary relative positional relationship between a first electrode, a first touch electrode and a second touch electrode of an exemplary organic light-emitting display panel in FIG. 2 consistent with disclosed embodiments.

FIG. 4 illustrates an exemplary relative positional relationship between a first electrode, a first touch electrode and a second touch electrode of an exemplary organic light-emitting display panel in FIG. 2 consistent with disclosed embodiments.

As shown in FIG. 2 and FIG. 4, the first touch electrode 222 and the second touch electrode 223 may be disposed in the same layer. That is, the second touch electrode 223 may also be disposed in the first electrode layer 220 of the organic light-emitting layer 22.

Further, in one embodiment, the second touch electrode 223 may extend in the same direction as the first touch electrode 222. That is, the second touch electrode 222 may extend in the first direction. A plurality of second touch electrodes may be arranged in the second direction.

In particular, the second touch electrode 223 may be disposed in the extension line of the first touch electrode 222. That is, the second touch electrodes 223 may be one-to-one corresponding to the first touch electrodes 222; and each second touch electrode 223 may be disposed on the extension line of the corresponding first touch electrode 222.

Further, for two first touch electrodes 222 and 222' of the organic light-emitting display panel, two second touch electrodes 223 and 223' may be disposed on the extension lines of the first touch electrodes 222 and 222', respectively. The sum of the length L1 of the first touch electrode 222 and the length L1' of the second touch electrode 223, may be equal to the sum of the length L2 of the first touch electrode 222' and the length L2' of the second touch electrode 223'.

As shown in FIG. 4, an insulating medium may be disposed between the first touch electrode 222 and the second touch electrode 223 disposed in the extension line of die corresponding first touch electrode 222. The first touch electrode 222, the second touch electrode 223 disposed oft the extension line of the corresponding first touch electrode 222, and the insulating medium disposed between the first touch electrode 222 and the second touch electrode 223 may form a capacitive structure, i.e., a capacitor.

In a touch stage, for example, a pulse driving signal may be transmitted to the first touch electrode. When a user's finger touches a position of die display panel, the coupling between the first touch electrode and the second touch electrode near the touched position may change, and the amount of charge stored by the capacitor formed by the first touch electrode and the second touch electrode near the touched position may change. Accordingly, the voltage difference between two terminals of the first and second touch electrodes may change. Thus, the coordinates of the touched position may be deduced based on whether or not the voltage difference of the first touch electrode and the second touch electrode changes.

In the disclosed embodiments, as shown in FIG. 4, a plurality of first touch electrodes 222 may be divided into a plurality of first touch electrode units 224. Each first touch electrode unit 224 may include a plurality of first touch electrodes 222. A plurality of second touch electrodes 223 may be divided into a plurality of second touch electrode units 225. Each second touch electrode unit 225 may include a plurality of second touch electrodes 223.

Figure 5A:
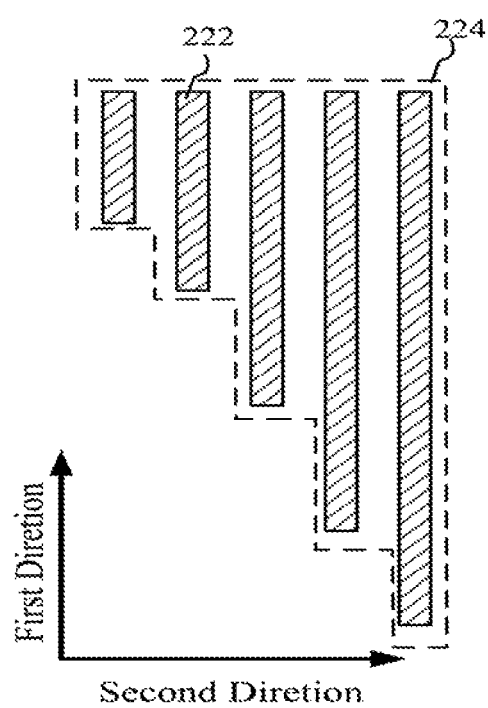
FIG. 5A illustrates a schematic diagram of an exemplary first touch electrode in FIG. 4 consistent with disclosed embodiments.
Figure 5B:
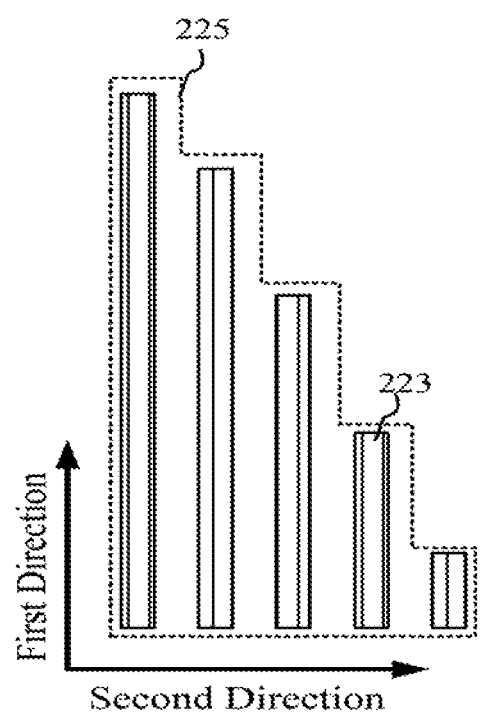
FIG. 5B illustrates a schematic diagram of an exemplary second touch electrode in FIG. 4 consistent with disclosed embodiments.

FIG. 5A illustrates a schematic diagram of an exemplary first touch electrode in FIG. 4 consistent with disclosed embodiments, and FIG. 5B illustrates a schematic diagram of an exemplary second touch electrode in FIG. 4 consistent with disclosed embodiments.

As shown in FIG. 5A, each first touch electrode 222 of the same first touch electrode unit 224 may have a different length. Meanwhile, the lengths of the plurality of first touch electrodes 222 of the same first touch electrode unit 224 may increase successively along the second direction, where the second direction may be perpendicular to the first direction.

As shown in FIG. 5B, each second touch electrode 223 of the same second touch electrode unit 225 may have a different length. Meanwhile, the lengths of the plurality of second touch electrodes 223 of the same second touch electrode unit 225 may decrease successively along the second direction.

In the disclosed embodiments, a plurality of first touch electrodes may be divided into a plurality of first touch electrode units, and the lengths of the plurality of first touch electrodes in the same first touch electrode unit may successively increase along the first direction. Meanwhile, a plurality of second touch electrodes may be divided into a plurality of second touch electrode units, and the lengths of the plurality of second touch electrodes in the same second touch electrode unit may successively decrease along the first direction.

Thus, the lengths of the first touch electrodes in the same first touch electrode trait or the lengths of the second touch electrodes in the same second touch electrode unit may be different along the first direction. The coordinates of the touched position in the first and second directions may be determined according to the first touch electrodes or the second touch electrodes within the same touch electrode unit.

For example, as shown in FIG. 4, when a touch happens at the touched position TP in FIG. 4, a change of the voltage difference on the first touch electrode 222" may be detected. Given that the point O is the origin, the coordinate of the touched position TP in the first direction may be determined based on the length of the second touch electrode 223" in the first direction, in which the second touch electrode 223' is corresponding to the first touch electrode 222". Further, the coordinate of the touched position TP in the second direction may be determined based on the coordinate of the first touch electrode 222" in the second direction.

Figure 6A:
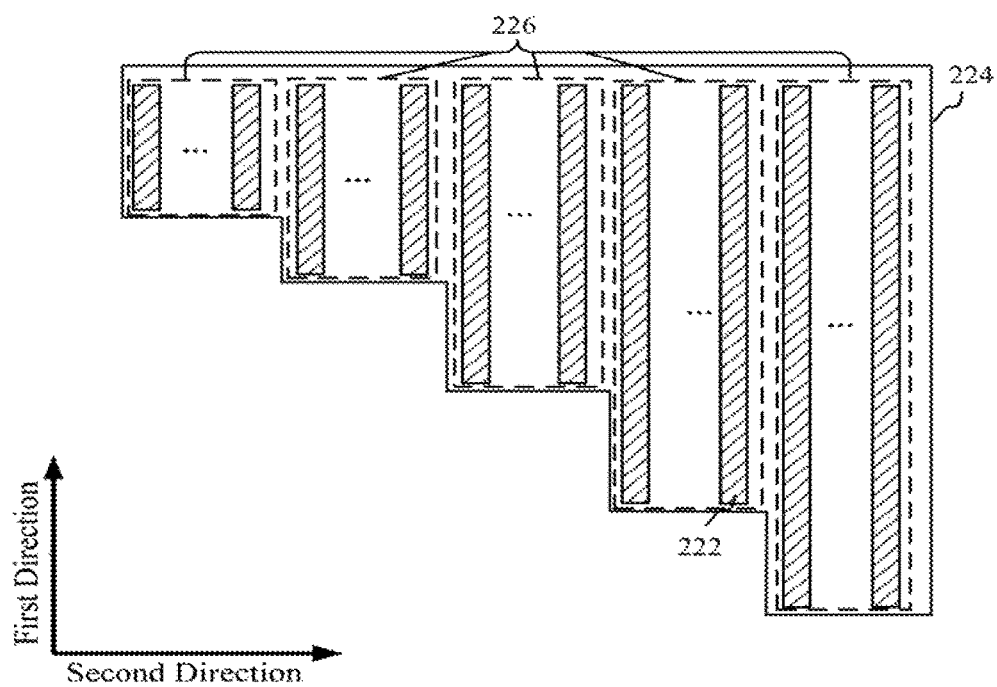
FIG. 6A illustrates another schematic diagram of an exemplary first touch electrode in FIG. 4 consistent with disclosed embodiments.
Figure 6B:
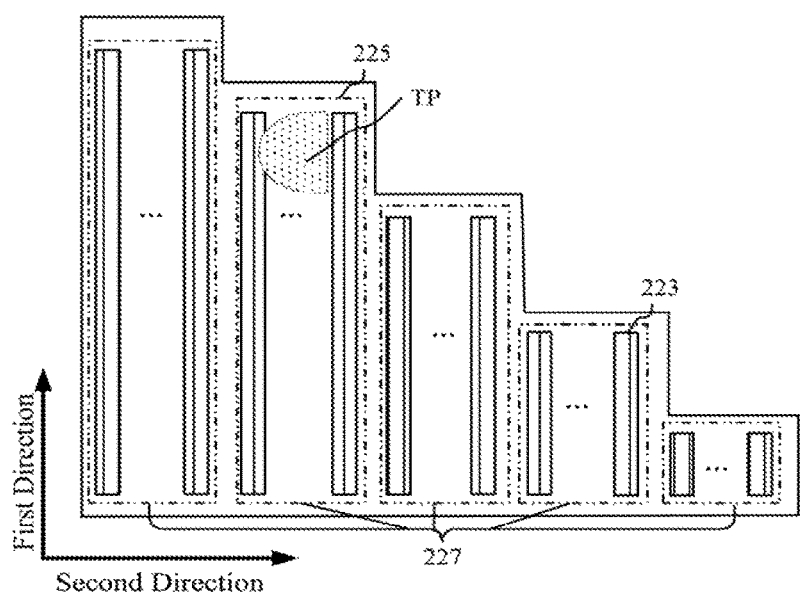
FIG. 6B illustrates another schematic diagram of an exemplary second touch electrode in FIG. 4 consistent with disclosed embodiments.

FIG. 6A illustrates another schematic diagram of an exemplary first touch electrode in FIG. 4 consistent with disclosed embodiments, and FIG. 6B illustrates another schematic diagram of an exemplary second touch electrode in FIG. 4 consistent with disclosed embodiments.

As shown in FIG. 6A, a first touch electrode unit 224 may include a plurality of first touch electrode groups 226, and each first touch electrode group 226 may include a plurality of first touch electrodes 222. The first touch electrodes 222 in the same first touch electrode group 226 may have the same length.

In the same first touch electrode unit 224, two first touch electrodes 222 in any two first touch electrode groups 226 may have different lengths.

In the same first touch electrode unit 224, the lengths of the first touch electrodes 222 in the plurality of first touch-electrode groups 226 may increase successively along the second direction.

As shown in FIG. 6B, a second touch electrode unit 225 may include a plurality of second touch electrode groups 227, and a second touch electrode group 227 may include a plurality of second touch electrodes 223. The second touch electrodes 223 in a same second touch electrode group 227 may have the same length.

In the same second touch electrode unit 225, two second touch electrodes 223 in two second touch electrode groups 227 may have different lengths.

In the same second touch electrode unit 225, the lengths of the second touch electrodes 223 in a plurality of second touch electrode groups 227 may decrease successively along the second direction.

In the disclosed embodiments, a plurality of first touch electrode groups may be provided in the same first touch electrode unit, and a plurality of first touch electrodes having the same length may be provided in the same first touch electrode group. Meanwhile, a plurality of second touch electrode groups may be provided in the same second touch electrode unit, and a plurality of second touch electrodes having the same length may be provided in the same second touch electrode group. Thus, the accuracy of the touch detection may be improved. As shown in FIG. 6B, when a touch happens at the touched position TP, a plurality of signals for changes in voltage differences may be detected. The superposition of the plurality of signals may improve the accuracy of the touch detection.

In the disclosed embodiments, the second touch electrodes may be disposed in the same layer as the first touch electrodes, and the second touch electrode may be disposed in the extension line of the corresponding first touch electrode. The first touch electrodes and the cathodes may be alternately arranged. Accordingly, the orthogonal projection of the first touch electrodes onto the plane of the array substrate may not overlap the orthogonal projection of the cathodes onto the plane of the array substrate. Meanwhile, the orthogonal projection of the second touch electrodes onto the plane of the array substrate may not overlap the orthogonal projection of the cathodes onto the plane of the array substrate.

Thus, the coupling capacitance between the first touch electrodes and cathodes may be reduced, and the coupling capacitance between die second touch electrodes and cathodes may be reduced. Accordingly, the influence of the cathodes on the touch performance in the touch stage may be suppressed, and the accuracy of the touch detection may be improved.

In one embodiment, as shown in FIG. 4, the first touch electrodes and the second touch electrodes may be disposed in the same film layer, i.e. the first electrode layer. In another embodiment, the second touch electrodes and the first touch electrodes may be disposed in different film layers.

Figure 7:
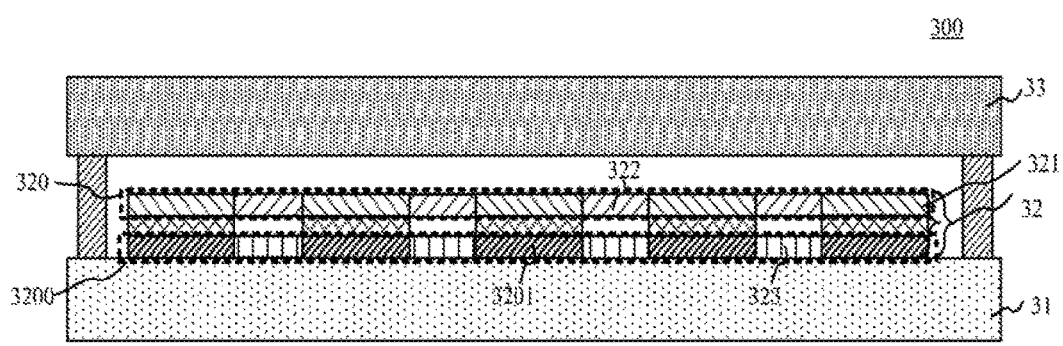
FIG. 7 illustrates a schematic diagram of another exemplary organic light-emitting display panel consistent with disclosed embodiments.
Figure 8:
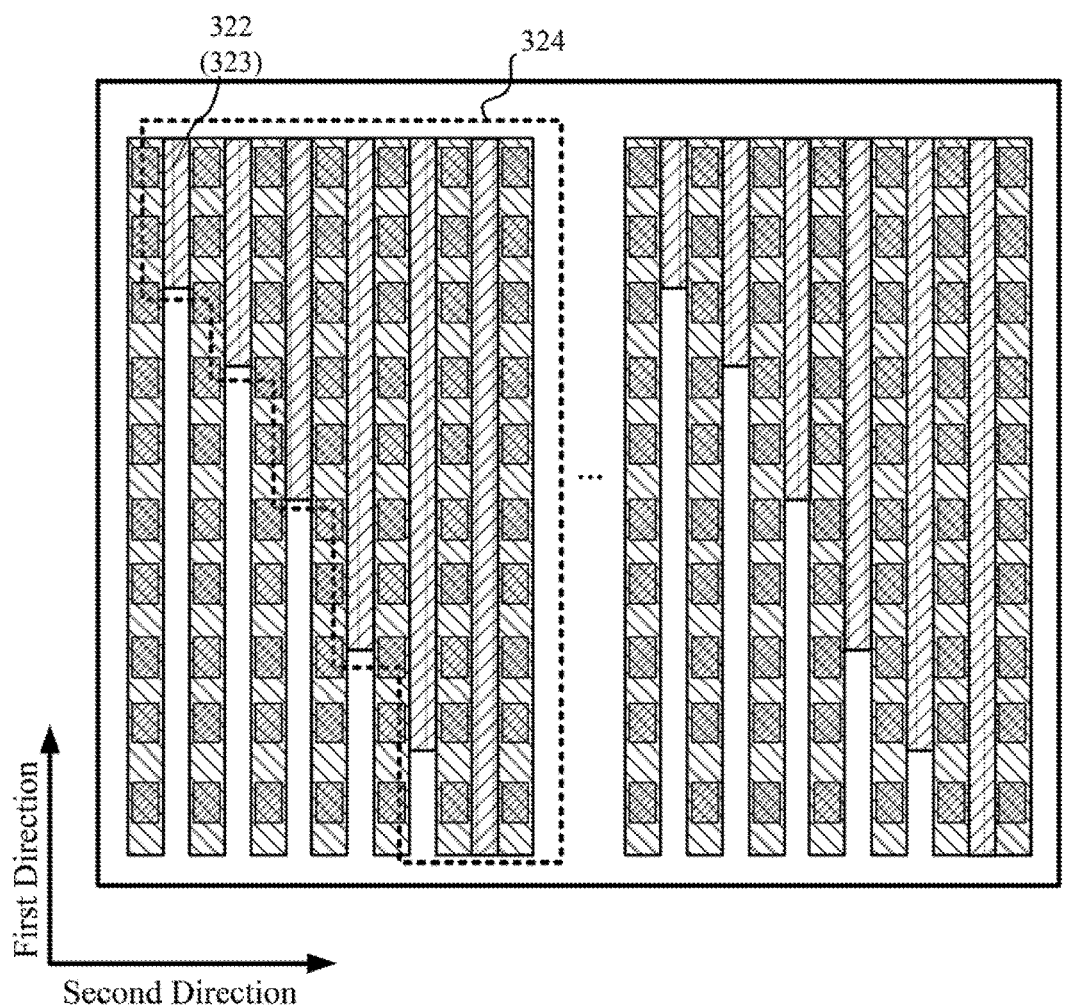
FIG. 8 illustrates an exemplary relative positional relationship between a first touch electrode, a second touch electrode and a first-electrode of an exemplary organic light-emitting display panel in FIG. 7 consistent with disclosed embodiments.

FIG. 7 illustrates a schematic diagram of another exemplary organic light-emitting display panel consistent with disclosed embodiments. FIG. 8 illustrates an exemplary relative positional relationship between a first touch electrode, a second touch electrode and a first electrode in an exemplary organic light-emitting display panel in FIG. 7 consistent with disclosed embodiments.

As shown in FIG. 7, similar to the organic light-emitting display panel in FIG. 2, the organic light-emitting display panel 300 in FIG. 7 may include an array substrate 31, a transparent cover plate 33, and an organic light-emitting layer 32 configured between the array substrate 31 and the transparent cover plate 33.

As shown in FIG. 7, in addition to the first electrode layer 320 which may be the same as the first electrode layer 220 in FIG. 2, the organic light-emitting layer 32 in FIG. 7 may further include a second electrode layer 3200. The second electrode layer 3200 may be, for example, an anode layer. The second electrode layer 3200 may include a plurality of second electrodes 3201, which may be, for example, anodes of an organic light-emitting display device. The plurality of second electrodes 3201 may be disposed on the array substrate and arranged in an array.

A plurality of anodes in the organic light-emitting layer may be configured to transmit current to the organic luminescent materials disposed between the anodes and the cathodes, such that the organic luminescent materials may emit light of the corresponding color. The light emitted from the organic luminescent materials may penetrate the cathodes and the transparent cover plate, thereby displaying images of the organic light-emitting display panel.

The second touch electrodes 323 may be disposed in the anode layer 3200. That is, the second touch electrodes 323 and the plurality of second electrodes 3201 may be disposed in the same layer. The second touch electrode 323 may be configured in parallel with the first touch electrode 322. That is, the second touch electrode 323 may extend in the first direction. A plurality of second touch electrodes 323 may be arranged in the second direction. A plurality of second electrodes arranged in the first direction, may be disposed between two second touch electrodes 323.

In one embodiment, as shown in FIG. 8, the orthogonal projection of a first touch electrode 322 onto the plane of the array substrate may overlap the orthogonal projection of the respective second touch electrode 323 onto the plane of the array substrate.

Similar to the organic light-emitting display panel in FIG. 4, in the organic light-emitting display panel shown in FIG. 8, a plurality of first touch electrodes 322 arranged in the second direction may be divided into a plurality of first touch electrode units 324. In the same first touch electrode unit 324, the lengths of a plurality of first touch electrodes 322 may successively increase in the second direction. It should be noted that a plurality of second touch electrodes 323 arranged in the second direction may be divided into a plurality of second touch electrode units (the second touch electrode unit may overlap the first touch electrode unit). In the same second touch electrode unit, the lengths of a plurality of second touch electrodes 323 may successively increase in the second direction.

The orthogonal projection of the first touch electrode onto the plane of the array substrate may overlap with the orthogonal projection of the second touch electrode onto the plane of the array substrate. A capacitive structure, i.e., a capacitor, may be formed by the first and second touch electrodes and the insulating medium between the first and second touch electrodes. For example, the first touch electrode may be a touch driving electrode, and the second touch electrode may be a touch detecting electrode. In the touch stage, a pulse driving signal may be transmitted to the first touch electrode, and a touch detecting signal may be received at the second touch electrode. Then, the coordinates of the touched position in the first direction and the second direction may be determined based on the touch detecting signal received at each second touch electrode.

If should be noted that, the first touch electrode and the second touch electrode may be disposed in different film layers, and may extend in parallel. When the orthogonal projection of the first and second touch electrodes onto the array substrate is not overlapped with the orthogonal projection of the cathodes onto the array substrate, the orthogonal projection of the first touch electrode onto the array substrate and the orthogonal projection of the second touch electrode onto the array substrate may partially overlap. The corresponding structure is shown in FIG. 8.

As shown in FIG. 8, by disposing the second touch electrodes in the anode layer and overlapping the orthogonal projection of the second touch electrodes onto the array substrate with the orthogonal projection of the first touch electrodes onto the array substrate, the orthogonal projection of the first and second touch electrodes onto the array substrate may not overlap with the orthogonal projection of cathodes onto the array substrate. Accordingly, the coupling capacitance between the first touch electrodes and the cathodes and the coupling capacitance between the second touch electrodes and the cathodes may be reduced. The influence of the cathodes on the touch performance may be suppressed, and the accuracy of the touch detection may be improved.

Figure 9:
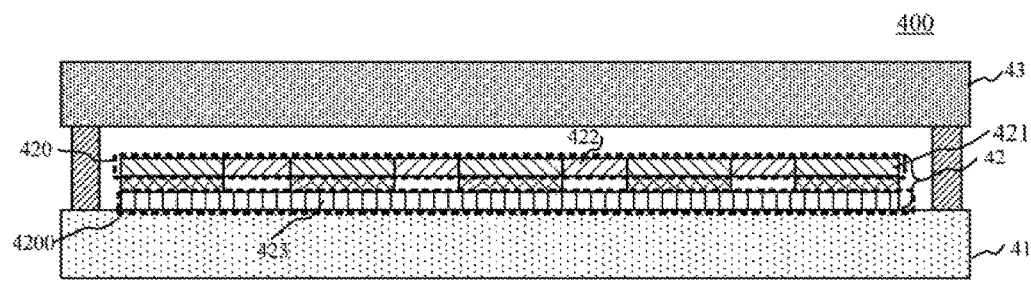
FIG. 9 illustrates a schematic diagram of another exemplary organic light-emitting display panel consistent with disclosed embodiments.
Figure 10:
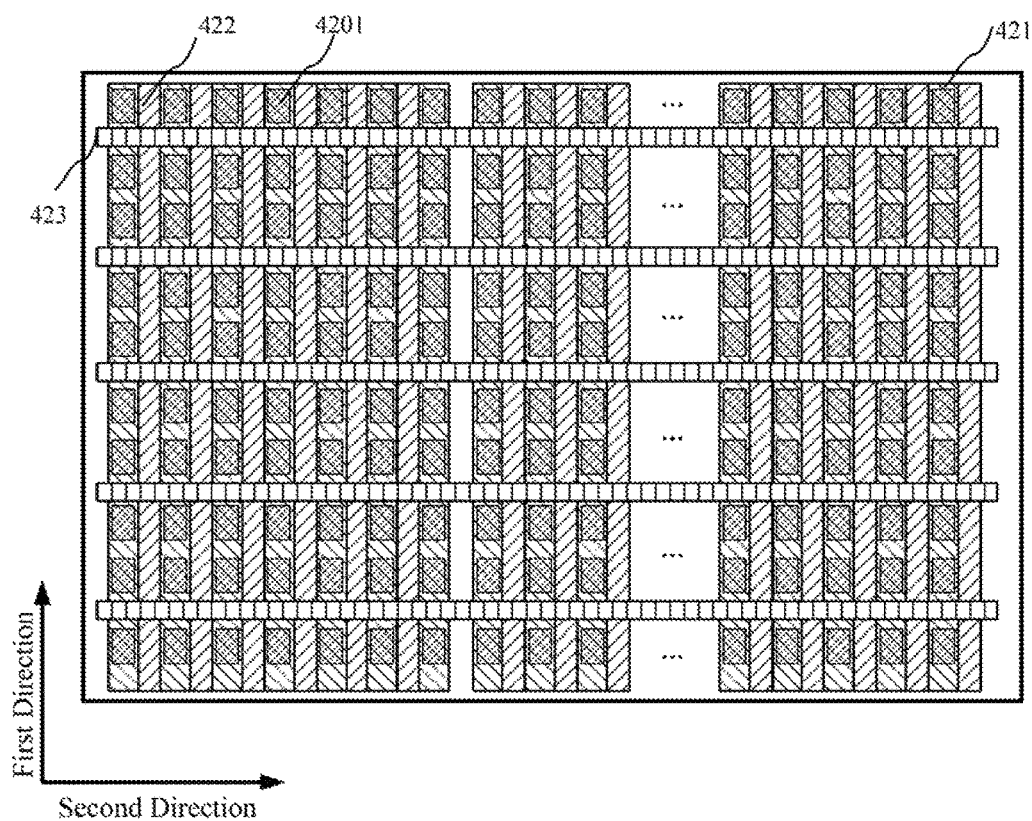
FIG. 10 illustrates an exemplary relative positional relationship between a first touch electrode, a second touch electrode and a first electrode in an exemplary organic light-emitting display panel in FIG. 9 consistent with disclosed embodiments.

FIG. 9 illustrates a schematic diagram of another exemplary organic light-emitting display panel consistent with disclosed embodiments; and FIG. 10 illustrates an exemplary relative positional relationship between a first touch electrode, a second touch electrode and a first electrode in an exemplary organic light-emitting display panel in FIG. 9 consistent with disclosed embodiments.

As shown in FIG. 9, similar to the display panel 300 in FIG. 7, the organic light-emitting display panel 400 in FIG. 9 may include an array substrate 41, a transparent cover plate 43, and an organic light-emitting layer 42 disposed between the array substrate 41 and the transparent cover plate 43. Further, the organic light-emitting layer 42 may include a first electrode layer 420 and a second electrode layer 4200. A plurality of first touch electrodes 422 may be disposed in the first electrode layer 420, and a plurality of second touch electrodes 423 may be disposed in the second electrode layer 4200, which will not be further described here.

Different from the organic light-emitting display panel 300 in FIG. 7, in the organic light-emitting display panel 400 shown in FIG. 10, the first electrode 421 may extend in the first direction, and a plurality of first electrodes 421 may be arranged in the second direction. The first touch electrode 422 may be parallel to the first electrode 421, and a plurality of first touch electrodes 422 may be arranged in the second direction. The second touch electrode 423 may extend in the second direction, and a plurality of second touch electrodes 423 may be arranged, in the first direction. That is, the second touch electrode 423 and the first touch electrode 422 may be configured to cross each other.

In certain embodiments, a plurality of second electrodes 4201 arranged along the second direction may be disposed between two second touch electrodes 423.

As shown in FIG. 10, the orthogonal projection of a second touch electrode 423 onto the plane of the array substrate may at least partially overlap with the orthogonal projection of a first touch electrode 422 onto the plane of the array substrate.

In the disclosed embodiments, a plurality of capacitive structures arranged in an array on the organic light-emitting display panel may be formed by a plurality of first touch electrodes 422, a plurality of second touch electrodes 423, and the insulating media configured between the first touch electrodes 422 and the second touch electrodes 423. In one embodiment, the first touch electrode 422 may be a touch detecting electrode; and the second touch electrode 423 may be a touch driving electrode. In another embodiment, the first touch electrode 422 may be a touch driving electrode; and the second touch electrode 423 may be a touch detecting electrode.

During the touch stage, for example, a touch driving signal may be transmitted on the first touch electrode 422, and a capacitor may be formed between the first touch electrode 422 and the second touch electrode 423. When a user's finger touches a position of the organic light-emitting display panel 400, the coupling between the first touch electrode 422 and the second touch electrode 423 near the touched position may change, such that the capacitance between the first touch electrode 422 and the second touch electrode 423 near the touched position may change. Accordingly, the coordinates of the touched position may be determined based on whether the capacitances of a plurality of capacitors formed by crossing the first touch electrodes 122 and the second touch electrodes 423 change.

In the disclosed embodiments, the second touch electrodes may be disposed in the second electrode layer. The orthogonal projection of the second touch electrodes onto the array substrate may have overlapped areas with the orthogonal projection of the first touch electrodes onto the array substrate, thereby forming a plurality of capacitive structures arranged in an array on the organic light-emitting display panel. Accordingly, the number of capacitors configured to detect the touched position may be increased, and the accuracy of the touch detection may be improved.

It should be noted that, when the first direction and the second direction are not perpendicular to each other, the orthogonal projection of one first touch electrode onto the plane of the array substrate may partially overlap with the orthogonal projection of one or more than one second touch electrodes onto the plane of the array substrate.

Figure 11:
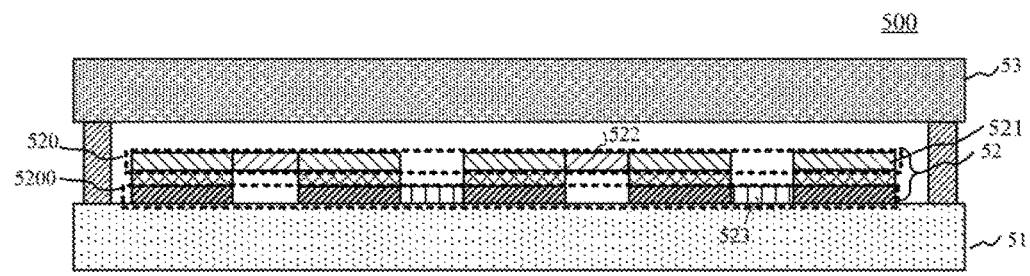
FIG. 11 illustrates a schematic diagram of another exemplary organic light-emitting display panel consistent with disclosed embodiments.
Figure 12:
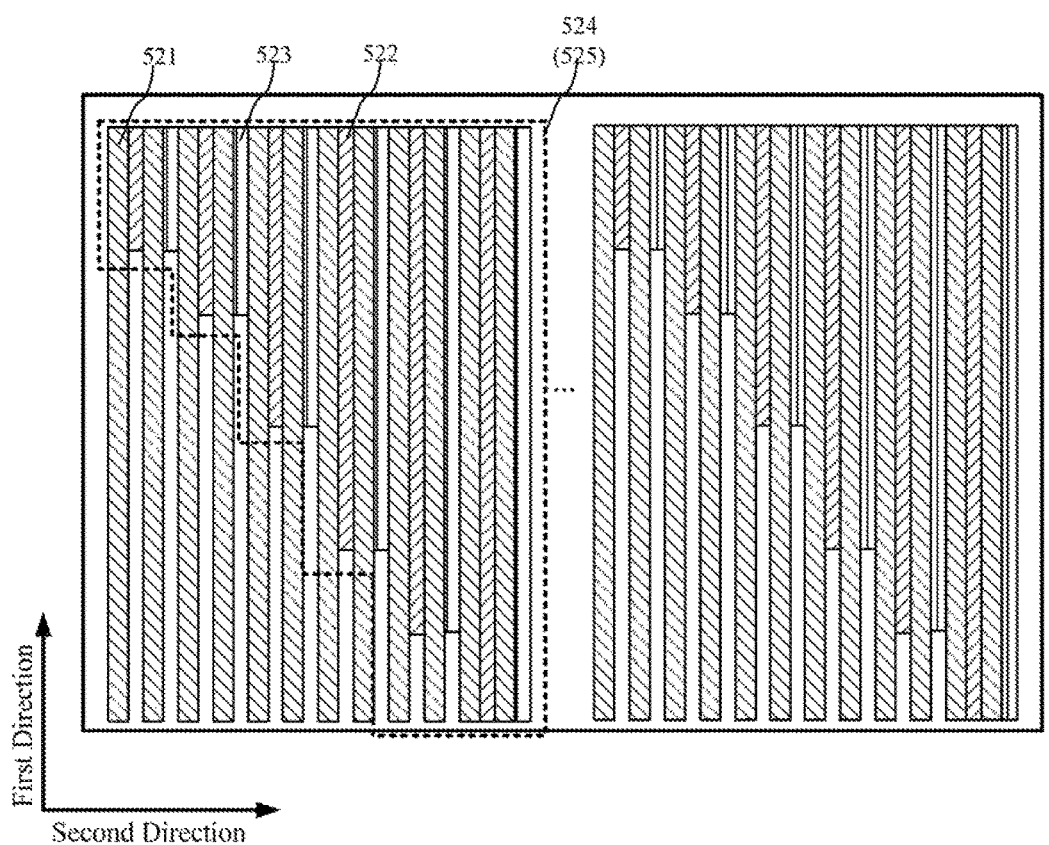
FIG. 12 illustrates an exemplary relative positional relationship between a first touch electrode, a second touch electrode and a first electrode in an exemplary organic light-emitting display panel in FIG. 11 consistent with disclosed embodiments.

FIG. 11 illustrates a schematic diagram of another exemplary organic light-emitting display panel consistent with disclosed embodiments, and FIG. 12 illustrates an exemplary relative positional relationship between a first touch electrode, a second touch electrode and a first electrode in an exemplary organic light-emitting display panel in FIG. 11 consistent with disclosed embodiments.

As shown in FIG. 11, similar to the organic light-emitting display panel 300 in FIG. 7, the organic light-emitting display panel 500 may include an array substrate 51, a transparent cover plate 53, and an organic light-emitting layer 52 disposed between the array substrate 51 and the transparent cover plate 53. The organic light-emitting layer 52 may include a first electrode layer 520 and a second electrode layer 5300.

The first electrode layer 520 may include a plurality of first electrodes and a plurality of first touch electrodes.

The second electrode layer 5200 may include a plurality of second electrodes and a plurality of second touch electrodes. As shown in FIG. 12, the plurality of first electrodes 521 may extend in the first direction and may be arranged in the second direction. The plurality of first touch electrodes 522 may extend in the same direction as the first electrodes 521 (i.e. the first direction), and may be arranged in the second direction.

The second touch electrode 523 may extend in the first direction, and the plurality of second touch electrodes 523 may be arranged in the second direction. The orthogonal projection of the first touch electrodes 522 and the orthogonal projection of the second touch electrode 523 onto the plane of the array substrate may be arranged alternately. The orthogonal projection of at least one first electrode 521 onto the plane of the array substrate may be disposed between the orthogonal projection of the first touch electrode 522 and the orthogonal projection of the second touch electrode 523 onto the plane of the array substrate.

The plurality of first touch electrodes 522 may be divided into a plurality of first touch electrode units 524, and the plurality of second touch electrodes 523 may be divided into a plurality of second touch electrode units 525.

Each first touch electrode unit 524 may include a plurality of first touch electrodes 522, and each second touch electrode unit 525 may include a plurality of second touch electrodes 523.

In certain embodiments, in the same first touch electrode unit 524, a first touch electrode 522 and the second touch electrode nearest to the first touch electrode 522 may have a same length.

The lengths of a plurality of first touch electrodes 522 in the same first touch electrode unit 524 may successively increase in the second direction. The lengths of a plurality of second touch electrodes 523 in the same second touch electrode unit 525 may successively increase in the second direction.

A first touch electrode and a second touch electrode having the same length as the first-touch, electrode may form a capacitive structure. The first touch electrode may be, for example, a touch driving electrode, and the second touch electrode may be, for example, a touch detecting electrode. In the touch stage, a touch driving signal may be transmitted to the first touch electrode, and the touched position may be determined by the signal received from the second touch electrode.

Figure 13:
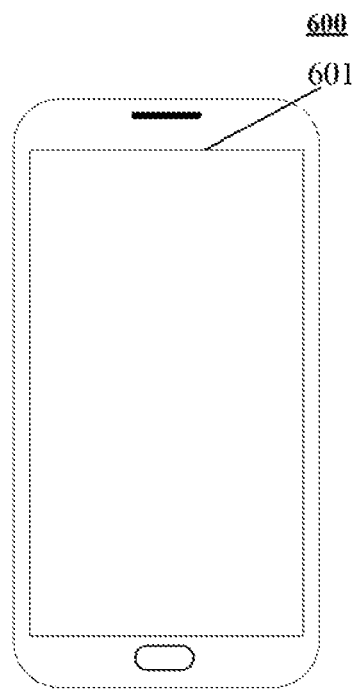
FIG. 13 illustrates a schematic view of an exemplary organic light-emitting display device consistent with disclosed embodiments.

The present disclosure also provides an organic light-emitting display device. FIG. 13 illustrates a schematic view of an exemplary organic light-emitting display device 600 consistent with disclosed embodiments. As shown in FIG. 13, the organic light-emitting display device 600 may include any one of the disclosed organic light-emitting display panels 601. The disclosed organic light-emitting display device 600 may be a cell phone, a computer, a tablet, a television, a monitor, and a smart wearable display device, etc. Any organic light-emitting display device comprising any one of the disclosed organic light-emitting display panels will fall within the scope of the present disclosure. Although a smart phone is shown in FIG. 13, the disclosed organic light-emitting display device is not limited to the smart phone.

It should be understood that, in addition to the display panel, the organic light-emitting display device 600 may also include other suitable structures, such as integrated circuits configured to provide display signals to the display panel, which will not be further described here.

The present disclose provides an organic light-emitting display panel and an organic light-emitting display device including the organic light-emitting display panel. The organic light-emitting display panel may include an array substrate, a transparent cover plate, and an organic light-emitting layer disposed between the array substrate and the transparent cover plate. A plurality of stripe-shaped first touch electrodes and a plurality of stripe-shaped second touch electrodes may be configured between the array substrate and the transparent cover plate. The first touch electrode may extend in the first direction, and the plurality of first touch electrodes may be arranged in the second direction. The organic light-emitting layer may include a first electrode layer. The first electrode layer may include a plurality of stripe-shaped first electrodes. The plurality of the first touch electrodes may be disposed in the same layer as the first electrodes.

The disclosed organic light-emitting display panel and organic light-emitting display device may reduce the coupling capacitances between the first touch electrodes and the cathode layer, reduce the influence of the cathodes on the touch performance during the touch stage, and improve the touch precision.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An organic light-emitting display panel, comprising:
   an array substrate;
   a transparent cover plate; and
   an organic light-emitting layer configured between the array substrate and the transparent cover plate,
   wherein the organic light-emitting layer comprises:
   a first electrode layer, as a cathode electrode layer, including a plurality of first electrodes extending in a first direction and arranged in a second direction,
   a plurality of first touch electrodes extending in the first direction, arranged in the second direction, and disposed in a same layer as the first electrode layer with each of the plurality of first touch electrodes being disposed between adjacent first electrodes, and
   a plurality of second touch electrodes, each of the plurality of second touch electrodes being disposed between the adjacent first electrodes.

2. The organic light-emitting display panel according to claim 1, wherein:
   the plurality of first touch electrodes and the plurality of second touch electrodes are disposed in a same layer.

3. The organic light-emitting display panel according to claim 2, wherein:
   a first touch electrode and a second touch electrode extend in a same direction; and
   the second touch electrode is disposed along an extension line of the first touch electrode.

4. The organic light-emitting display panel according to claim 1, wherein:
   at least one first electrode is disposed between two adjacent first touch electrodes.

5. The organic light-emitting display panel according to claim 4, wherein:
   a total length of the first touch electrode and the second touch electrode disposed along the extension line of the first touch electrode, is equal to the total length of another first touch electrode and another second touch electrode disposed along the extension line of the another first touch electrode.

6. The organic light-emitting display panel according to claim 1, wherein:
   the plurality of first touch electrodes are divided into a plurality of first touch electrode units;
   a first touch electrode unit includes more than one first touch electrodes;
   the plurality of second touch electrodes are divided into a plurality of second touch electrode units; and
   a second touch electrode unit includes more than one second touch electrodes.

7. The organic light-emitting display panel according to claim 6, wherein:
   the more than one first touch electrodes in a same first touch electrode unit have different lengths; and
   lengths of the more than one first touch electrodes in the same first touch electrode unit increase successively in the second direction.

8. The organic light-emitting display panel according to claim 7, wherein:
   the plurality of second touch electrodes are arranged in the second direction;
   the more than one second touch electrodes in a same second touch electrode unit have different lengths; and
   lengths of the more than one second touch electrodes in the same second touch electrode unit have decrease successively in the second direction.

9. The organic light-emitting display panel according to claim 6, wherein:
   the first touch electrode unit includes a plurality of first touch electrode groups;
   a first touch electrode group includes more than one first touch electrodes;
   the more than one first touch electrodes in a same first touch electrode group have same lengths;
   within a same first touch electrode unit, lengths of the more than one first touch electrodes in the first touch electrode group are different from the more than one first touch electrodes in another first touch electrode group; and
   within the same first touch electrode unit, the lengths of the more than one first touch electrodes in the plurality of first touch electrode groups increase successively in the second direction.

10. The organic light-emitting display panel according to claim 9, wherein:
    the plurality of second touch electrodes are arranged in the second direction;
    the second touch electrode unit includes a plurality of second touch electrode groups;
    a second touch electrode group includes more than one second touch electrodes;
    the more than one second touch electrodes in a same second touch electrode group have same lengths;
    within a same second touch electrode unit, lengths of the more than one second touch electrodes in the second touch electrode group are different from the more than one second touch electrodes in another second touch electrode group, and
    within the same second touch electrode unit, the lengths of the more than one second touch electrodes in the plurality of second touch electrode groups decrease successively in the second direction.

11. The organic light-emitting display panel according to claim 1, wherein:
    the plurality of first touch electrodes and the plurality of second touch electrodes are disposed in different film layers.

12. The organic light-emitting display panel according to claim 11, wherein:

an orthogonal projection of a first touch electrode on the array substrate at least partially overlaps an orthogonal projection of at least one second touch electrode on the array substrate.

13. The organic light-emitting display panel according to claim 12, wherein:
the light-emitting layer further includes a second electrode layer;
the second electrode layer includes a plurality of second electrodes;
the plurality of second touch electrodes and the plurality of second electrodes are disposed in a same layer;
the second electrode layer is an anode layer; and
a second electrode is an anode.

14. The organic light-emitting display panel according to claim 13, wherein:
the plurality of second touch electrodes is arranged parallel to the plurality of first touch electrodes; and
more than one second electrodes arranged in the first direction are disposed between two second touch electrodes.

15. The organic light-emitting display panel according to claim 14, wherein:
the orthogonal projection of the first touch electrode on the array substrate overlaps the orthogonal projection of the second touch electrode on the array substrate.

16. The organic light-emitting display panel according to claim 15, wherein:
the plurality of first touch electrodes are divided into a plurality of first touch electrode units;
the plurality of second touch electrodes are divided into a plurality of second touch electrode units;
a first touch electrode unit includes more than one first touch electrodes;
a second touch electrode unit includes more than one second touch electrodes;
lengths of the more than one of first touch electrodes in a same first touch electrode unit increase successively in the second direction; and
lengths of the more than one second touch electrodes in a same second touch electrode unit increase successively in the second direction.

17. The organic light-emitting display panel according to claim 13, wherein:
a first electrode is parallel to the first touch electrode;
a second touch electrode extends in the second direction;
the plurality of second touch electrodes are arranged in the first direction;
more than one second electrodes arranged in the second direction are disposed between two second touch electrodes; and
the orthogonal projection of the second touch electrode onto the array substrate at least partially overlaps with the orthogonal projection of the first touch electrode onto the array substrate.

18. The organic light-emitting display panel according to claim 11, wherein:
the plurality of first touch electrodes extend in the first direction and are arranged in the second direction;
a second touch electrode is arranged parallel to a first touch electrode;
an orthogonal projection of the first touch electrode onto the array substrate and the orthogonal projection of the second touch electrode onto the array substrate are arranged alternately; and
the orthogonal projection of at least one first electrode onto the array substrate is disposed between the orthogonal projection of the first touch electrode onto the array substrate and the orthogonal projection of the second touch electrode onto the array substrate.

19. The organic light-emitting display panel according to claim 11, wherein:
a first touch electrode is a touch driving electrode, and a second touch electrode is a touch detecting electrode; or
the first touch electrode is a touch detecting electrode, and the second touch electrode is a touch driving electrode.

20. A display device, comprising an organic light-emitting display panel, wherein the organic light-emitting display panel comprises:
an array substrate;
a transparent cover plate; and
an organic light-emitting layer configured between the array substrate and the transparent cover plate,
wherein the organic light-emitting layer comprises:
a first electrode layer, as a cathode electrode layer, including a plurality of first electrodes extending in a first direction and arranged in a second direction,
a plurality of first touch electrodes extending in the first direction, arranged in the second direction, and disposed in a same layer as the first electrode layer with each of the plurality of first touch electrodes being disposed between adjacent first electrodes, and
a plurality of second touch electrodes, each of the plurality of second touch electrodes being disposed between adjacent first electrodes.

* * * * *